United States Patent
Chin

(10) Patent No.: US 11,262,817 B2
(45) Date of Patent: Mar. 1, 2022

(54) DISPLAY DEVICE

(71) Applicant: LG ELECTRONICS INC., Seoul (KR)

(72) Inventor: Injae Chin, Seoul (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 16/770,578

(22) PCT Filed: Apr. 6, 2018

(86) PCT No.: PCT/KR2018/004049
§ 371 (c)(1),
(2) Date: Jun. 5, 2020

(87) PCT Pub. No.: WO2019/124643
PCT Pub. Date: Jun. 27, 2019

(65) Prior Publication Data
US 2021/0165472 A1    Jun. 3, 2021

(30) Foreign Application Priority Data
Dec. 18, 2017  (KR) .................. 10-2017-0174446

(51) Int. Cl.
*G06F 1/20*     (2006.01)
*G05D 7/06*    (2006.01)
(Continued)

(52) U.S. Cl.
CPC .......... *G06F 1/203* (2013.01); *G01K 13/024* (2021.01); *G05D 7/06* (2013.01); *G06F 1/1647* (2013.01);
(Continued)

(58) Field of Classification Search
CPC ...... G06F 1/203; G06F 1/20; G06F 2200/201; G06F 1/1647; G06F 1/206; G01K 13/024;
(Continued)

(56) References Cited

U.S. PATENT DOCUMENTS 5,991,153 A * 11/1999 Heady ................ H05K 7/20972
361/704
10,088,702 B2 * 10/2018 Dunn ................ G02F 1/133382
(Continued)

FOREIGN PATENT DOCUMENTS

| JP | 2010102227    | 5/2010  |
| JP | 2013102102    | 5/2013  |
| KR | 1020090114828 | 11/2009 |
| KR | 1020120114905 | 10/2012 |
| KR | 1020160148003 | 12/2016 |

OTHER PUBLICATIONS

Noguchi et al., Outdoor both side display device, May 6, 2010 (Year: 2010).*

(Continued)

*Primary Examiner* — Michael A Matey
(74) *Attorney, Agent, or Firm* — Lee, Hong, Degerman, Kang & Waimey PC

(57) ABSTRACT

Disclosed is a direct cooling-type display device having a double-sided display, the display device being configured to implement efficient heat radiation and comprising: a first display; a second display provided such that the back surface thereof faces the back surface of the first display; a housing for mounting the first display; an inlet port formed in the housing so as to form a path along which external air flows in; a first discharge port formed in a first area in which the first display is provided; a second discharge port formed in a second area in which the second display is provided; a first temperature measurement portion for measuring the temperature in the second area; a first outlet fan for discharging air in the first are through the first discharge port; a second (Continued)

outlet fan for discharging air in the second area through the second discharge port; a first backflow prevention portion provided in the first discharge port so as to prevent air from flowing from outside the housing into the same through the first discharge port; a second backflow prevention portion provided in the second discharge port so as to prevent air from flowing from outside the housing into the same through the second discharge port; and a flow rate control portion for driving the first outlet fan and the second outlet fan on the based of the measured temperature in the first area and the measured temperature in the second area.

10 Claims, 6 Drawing Sheets

(51) Int. Cl.
*G06F 1/16* (2006.01)
*H05K 7/20* (2006.01)
*G01K 13/024* (2021.01)

(52) U.S. Cl.
CPC ......... *G06F 1/206* (2013.01); *H05K 7/20972* (2013.01)

(58) Field of Classification Search
CPC ............... G05D 7/06; G02F 1/133342; G02F 1/133628; G02F 1/133385; G02F 2201/36; H05K 7/20172; H05K 5/0017; H05K 7/20209; H05K 7/20145; H05K 7/20972; H05K 7/202; H05K 7/20836; F21V 29/67; F21V 29/673; H01L 51/529
See application file for complete search history.

(56) References Cited

U.S. PATENT DOCUMENTS

| | | | |
|---|---|---|---|
| 2011/0058326 A1* | 3/2011 | Idems | G09F 9/30 361/679.21 |
| 2011/0085301 A1* | 4/2011 | Dunn | H05K 7/20972 361/695 |
| 2011/0085302 A1* | 4/2011 | Nakamichi | H05K 7/20972 361/695 |
| 2011/0167845 A1* | 7/2011 | Lee | F04D 25/166 62/89 |
| 2012/0255721 A1* | 10/2012 | Kim | G09F 19/22 165/288 |
| 2013/0081779 A1* | 4/2013 | Liao | G06F 1/203 165/11.1 |
| 2014/0313666 A1* | 10/2014 | Chin | H05K 7/20972 361/692 |
| 2014/0334100 A1* | 11/2014 | Yoon | G09F 9/33 361/692 |
| 2015/0009625 A1* | 1/2015 | Chin | G02F 1/133382 361/695 |
| 2017/0257978 A1 | 9/2017 | Diaz | |
| 2020/0387203 A1* | 12/2020 | Whitehead | G02F 1/1336 |
| 2020/0390009 A1* | 12/2020 | Whitehead | H05K 7/20145 |

OTHER PUBLICATIONS

Fujinuma Tsuneo, Cooling device in housing, May 23, 2013 (Year: 2013).*
PCT International Application No. PCT/KR2018/004049, Written Opinion of the International Searching Authority dated Sep. 5, 2018, 19 pages.
European Patent Office Application Serial No. 18890639.0, Search Report dated Aug. 12, 2021, 5 pages.

* cited by examiner

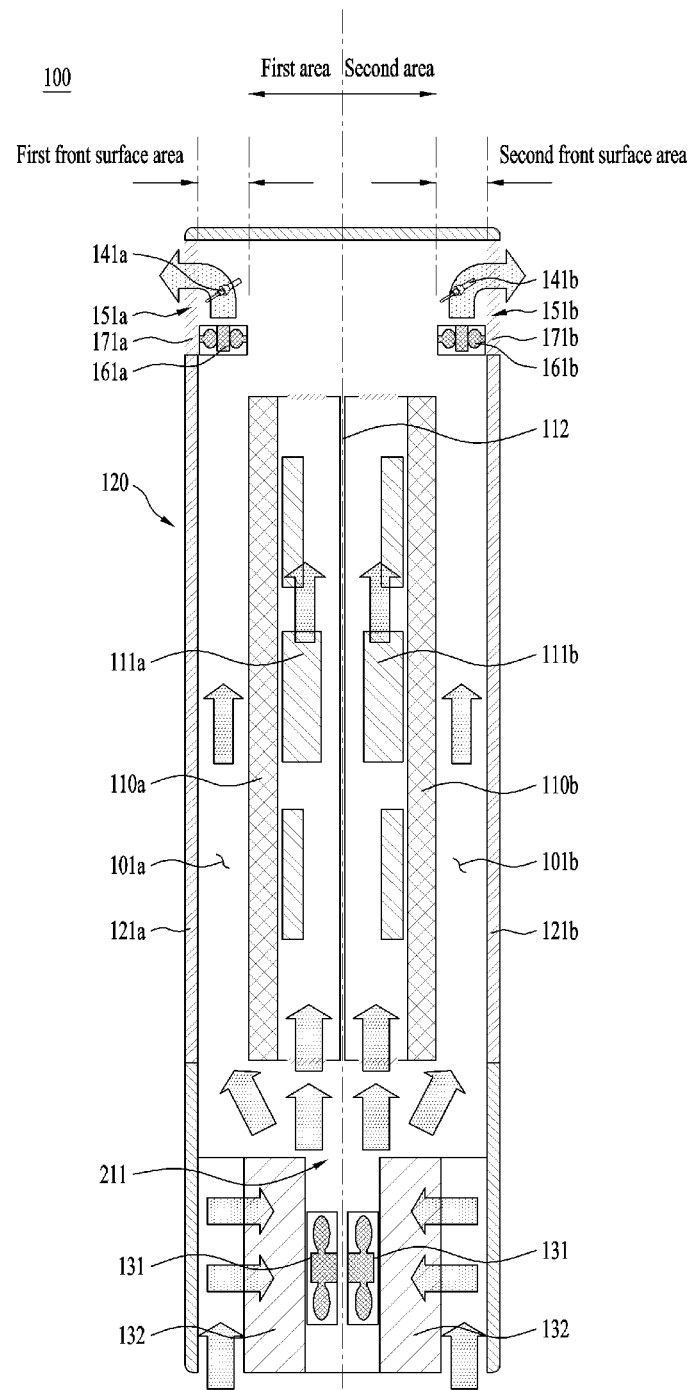

[Figure 6]
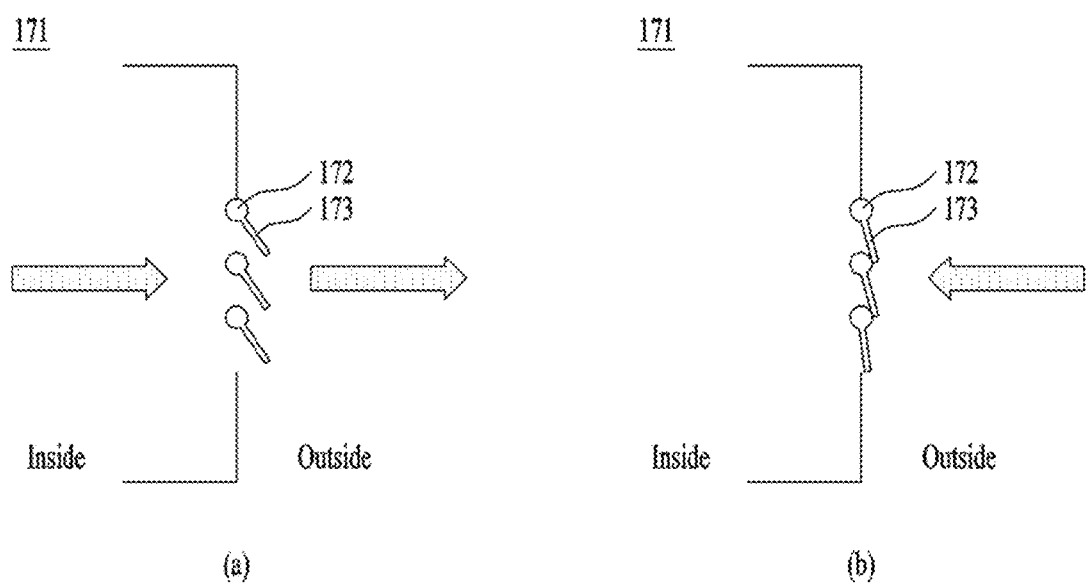

DISPLAY DEVICE

CROSS-REFERENCE TO RELATED APPLICATIONS

This application is the National Stage filing under 35 U.S.C. 371 of International Application No. PCT/KR2018/004049, filed on Apr. 6, 2018, which claims the benefit of earlier filing date and right of priority to Korean Application No. 10-2017-0174446, filed on Dec. 18, 2017, the contents of which are all hereby incorporated by reference herein in their entirety.

FIELD

Embodiments of the present disclosure relate to a display device that is invented in consideration with a heat dissipation structure.

BACKGROUND

A display device means one mechanical unit that defines an exterior design of a display module mounted therein.

When located in outdoor place with many foreign substances (e.g., dust or contaminants) or a severe temperature difference, a display device in which a large-inched display is mounted has to be provided with a relatively high luminance for sufficient outdoor visibility. Also, such a display device is likely to be neglected at high outdoor temperatures. Accordingly, such the display device is required to have a heat dissipation structure configured to efficiently radiate the heat generated in driving the display.

The heat dissipation structure provided in the display device may be realized in diverse methods.

The heat dissipation may be classified into an air-cooling method and a water-cooling method based on a heat transfer mediator provided to perform heat dissipation. The air-cooling method may use a heat dissipation fin or the like in maximize a surface area to enhance heat dissipation efficiency. The water-cooling method may use a heat pipe or the like in guiding a path or block of a heat transfer material to enhance the heat dissipation efficiency.

Each of the heat dissipation cooling methods may be used independently or two or more of the methods may be combined.

In the air cooling type display device, a direct cooling structure configured to directly exchange heat with the elements of the device or a heat exchanger may be provided so as to shut off the external air from the internal air and generate only heat exchange with each other.

Generally, the direct cooling structure is configured to suck the air filtered by a dust filter so as to protect the inner elements of the display device.

The display device may be provided as a double-sided display that is having displays provided to both sides, respectively, to output images on both sides.

The direct cooling display device having the double-sided display might have the heat generated by the both displays or the unbalance of the heat transferred to the displays, because the structures and arrangements of the displays are different from each other.

If a heat dissipation system having a uniformly low output is applied to the display device in which unbalance occurs in both sides, sufficient heat dissipation could not be performed in one display having much heat generated therein. In contrast, if a heat dissipation system having a uniformly high output is applied to the display device, unnecessary energy might be consumed even for the other display in which less heat is generated and energy efficiency may be lowered accordingly.

In addition, when both displays are realized in respective independent structures, the lifespan of the filter or fan provided in one display might be different from that of the filter or fan provided in the other one such that exchanging periods of the filters or fans might be different, only to make repair and maintenance be inefficient.

DETAILED DESCRIPTION OF THE INVENTION

Technical Problem

To overcome the disadvantages, an object of the present invention is to address the above-noted and other problems and to provide a refrigerator having an enhanced energy efficiency and a controlling method for the same and provide efficient heat dissipation in a direct cooling display device having double-sided display.

Technical Solution

To achieve these objects and other advantages and in accordance with the purpose of the embodiments, as embodied and broadly described herein, a display device may be provided.

The display device may comprise a first display; a second display comprising a back surface facing a back surface of the first display; a housing in which the first display and the second display are mounted; an inlet hole provided in the housing and configured to form a flow of external air drawn into the housing; a first outlet hole formed in a first area where the first display is provided; a second outlet hole formed in a second area where the second display is provided; a first temperature measuring part configured to measure the temperature in the first area; a second temperature measuring part configured to measure the temperature in the second area; a first outlet fan configured to discharge the air in the first area through the first outlet hole; a second outlet fan configured to discharge the air in the second area through the second outlet hole; a first backflow preventing part provided in the first outlet hole and configured to prevent air from flowing back into the housing from the outside through the first outlet hole; a second backflow preventing part provided in the second outlet hole and configured to prevent air from flowing back into the housing from the outside through the second outlet hole; and an flow rate controller configured to drive the first outlet fan and the second outlet fan based on the temperature measured in the first area and the temperature measured in the second area The flow rate controller may control the airflow caused by the first outlet fan to be more than the airflow caused by the second outlet fan, when the temperature in the first area is higher than the temperature in the second area, and the flow rate controller may control the airflow caused by the second outlet fan to be more than the airflow caused by the first outlet fan, when the temperature in the second area is higher than the temperature in the first area.

The flow rate controller may drive the first outlet fan when the temperature in the first area is higher than a first preset critical temperature and drive the second outlet fan when the temperature in the second area is higher than a second preset critical temperature.

The first outlet fan may be provided in a predetermined position of the first area that is adjacent to the first outlet hole, and the second outlet fan may be provided in a predetermined position of the second area that is adjacent to the second outlet hole.

The display device may further comprise an inlet fan configured to draw air into the housing through the inlet hole; and a dust filter provided in the inlet hole, wherein one inlet hole and one dust filter are provided.

The display device may further comprise a circuit unit provided between the first display and the second display and configured to drive the first display or the second display; a first front surface area formed between a front surface of the first display and a predetermined area of the housing that faces the front surface of the first display; and a second front surface area formed between the front surface of the second display device and another predetermined area of the housing that faces the front surface of the second display.

The inlet hole, the first outlet hole and the second outlet hole may be provided in a lower end of each display to discharge the air drawn through the inlet hole to the outside through the outlet holes after passing an upper end area of each display and each front surface area.

The display device may further comprise a first partition bracket provided in a lower end of the first display and configured to partition off an area between the inlet hole and the first outlet hole; and a second partition bracket provided in a lower end of the second display and configured to partition off an area between the inlet hole and the second outlet hole.

The inlet hole may be provided in a lower end of each display, and the first outlet hole and the second outlet hole are provided in respective upper ends of the displays, and the air having passed the inlet hole may be drawn into the circuit unit and a lower end of the first front surface area simultaneously or the circuit unit and a lower end of the second front surface area simultaneously so as to flow towards upper ends of the displays.

The first temperature measuring part may be provided adjacent to the first outlet hole and the second temperature measuring part is provided adjacent to the second outlet hole.

The backflow preventing part may comprise a hinge unit; and a thin film rotatably coupled to the hinge unit and configured to rotate to be open when the airflow is formed from the inside to the outside of the housing and rotate to be closed when the airflow is formed from the outside to the inside of the housing.

Advantageous Effects

Accordingly, the embodiments have following advantageous effects.

According to at least one embodiment of the present disclosure, the heat dissipation efficiency of the display device may be enhanced.

Furthermore, the thickness of the display device may be minimized.

Still further, the manufacturing cost of the display device may be reduced.

Still further, the display device may prevent an air backflow.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

FIG. 5 is a diagram illustrating another embodiment that is different from the embodiment of FIG. 4; and FIG. 6 is a diagram illustrating one example of a backflow preventing part related with the present disclosure.

DESCRIPTION OF SPECIFIC EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings. It will be understood that although the terms first, second, etc. may be used herein to describe various elements, these elements should not be limited by these terms. These terms are generally only used to distinguish one element from another.

A display device according to the present disclosure includes all types of devices having an output unit configured to output an image. Examples of such display device include a digital TV, an analog TV, desk top computer, a digital signage and etc.

In addition, the examples of the display device may also include a middle-sized or large-sized output device (e.g., a signage that is installed in an outdoor enclosure).

As one example, the display may be an outdoor billboard.

As described above, the present disclosure is invented to focus on a display device such as a signage that is installed in such the outdoor enclosure.

Figure 1:
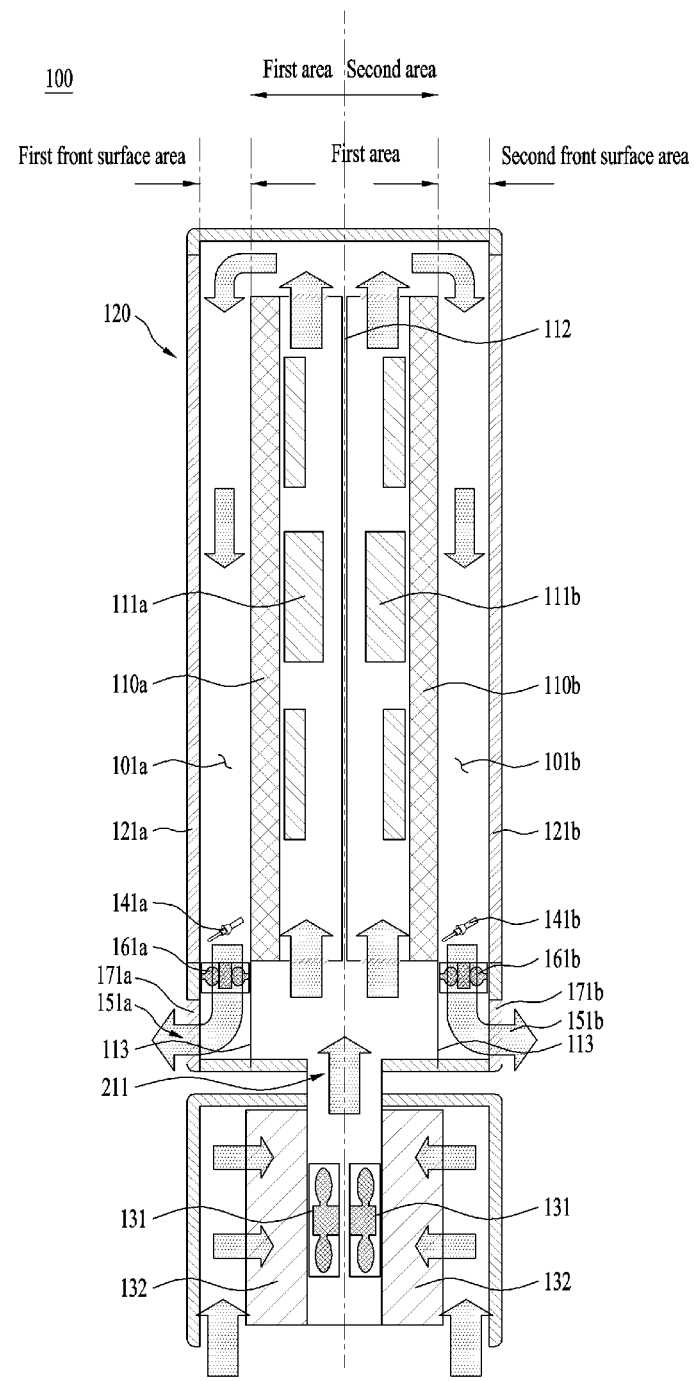
FIG. 1 is a conceptual diagram illustrating one cross section of a display device that is related with the present disclosure.

FIG. 1 is a conceptual diagram illustrating one cross section of a display device that is related with the present disclosure.

The display device 100 according to the present disclosure may include a first display 110*a* and a second display 110*b* of which back surfaces face each other. The first display 110*a* and the second display 110*b* may face one surface and the other surface of the display device 100, respectively, to output an image, which is one type of the double-sided display mentioned above. The display device 100 including the double-sided display may be configured to be in left and right symmetry with respect to a central axis, only without special statement. Accordingly, 'a' is added to one side and 'b' to the other side of the common element.

A housing 120 may be provided to define an exterior design of the display device 100 and configured to mount the first display 110a and the second display 110b therein. The housing 120 may include a first window 121a that is provided in a predetermined area facing a front surface of the first display 110a and a second window 121b that is provided in another area facing a front surface of the second display 110b, so as to allow the display device 110 visible outside.

The housing 120 may form a flow path. The flow path of the display device means a flow path of external air from an inlet point to an outlet point past the internal elements. The housing 120 that forms the air flow path of the display device 100 may enclose the other area except an inlet hole 211 and an outlet hole 151 so as to prevent unintended air discharging or drawing.

A circuit unit 111 may be provided between the first display 110a and the second display 110b. The circuit unit 111 may be configured to perform electronic control for facilitating the image output of the first display 110a or the second display 110b. The circuit unit 111 may be divided into a first circuit part 111a configured to drive the first display 110a and a second circuit part 111b configured to drive the second display 110b. each part of the circuit unit 111 may be partitioned off by a partition bracket 112 or face the other without the partition bracket 112. Unless the partition bracket 112 is provided in case a space between the first display 110a and the second display 110b is narrow, the air flow may be formed effectively fluid.

The space that forms a uniform width between the first display 110a and the housing, especially, the first window 121a to facilitate air flow may be defined as a first front surface space 101a. The space that forms a uniform width between the second display 110b and the housing, especially the second window 121b to facilitate air flow may be defined as a second front surface space 101b.

A predetermined area of the inner space of the housing 120 where the first display is provided 110a may be defined as a first area and another predetermined area of the inner space where the second display 110b is provided may be defined as a second area.

Considering a virtual center line that is connected between the first display 110a and the second display 110b, one of the two area partitioned off from the inner space of the housing 120 by the virtual center line, where the first display 110a is provided, may be defined as a first area and the other area where the second display 110b is provided may be defined as a second area.

Accordingly, the heat of the first area could be mainly generated by the first display 110a and the heat of the second area could be mainly generated by the second display 110b.

An inlet fan 131 may be provided to facilitate air flux and an outlet fan may be provided to allow the air drawn into the housing 120 to receive the heat and discharge out of the housing 120.

The air flux formed by the inlet fan 131 may be drawn through an inlet hole 211 formed in the housing 120. A dust filter 132 may be provided in the inlet hole 211 or a plurality of dust filters may be provided. However, the amount of the dust may be similar even in the single or plural dust filters and the time to replace them is also similar.

To achieve the purpose, at least one of the inlet hole 211 or the dust filter 132 may be provided as a single one, not the plural ones.

The inlet fan 131, the dust filter 132 and the inlet hole 211 may be provided in a lower end of the housing 120 to minimize the visibility of those elements and the unpleasant feelings given to passersby that are caused by wind.

The first outlet fan 161a and the second outlet fan 161b may be provided in the housing 120. The first outlet fan 161a may form the air flux to discharge air from the first area to the outside the housing 120 through a first outlet hole 151a. The second outlet fan 161b may form the air flux to discharge air from the second area to the outside the housing 120 through a second outlet hole 151b. In other words, the first outlet fan 161a may be configured to mainly radiate the heat generated in the first display 110a and the second outlet fan 161b may be configured to mainly radiate the heat generated in the second display 110b.

The housing 120 may have a first outlet 151a for discharging the air of the first area and a second outlet hole 151b for discharging the air of the second area. Accordingly, the first outlet hole 151a may be formed near the first area and the second outlet hole 151b may be formed near the second area. The consideration about the specific positions of the first and second outlet holes 151a and 151b will be described later.

An airflow amount controller may be configured to drive the outlet fan 161 with a different output for the first and second outlet fans 161a and 161b based on the temperature in the first area and the temperature in the second area.

A first temperature measuring part 141a may be provided in the first area and configured to measure the temperature of the air in the first area. A second temperature measuring part 141b may be provided in the second area and configured to measure the temperature in the second area.

Figure 2:
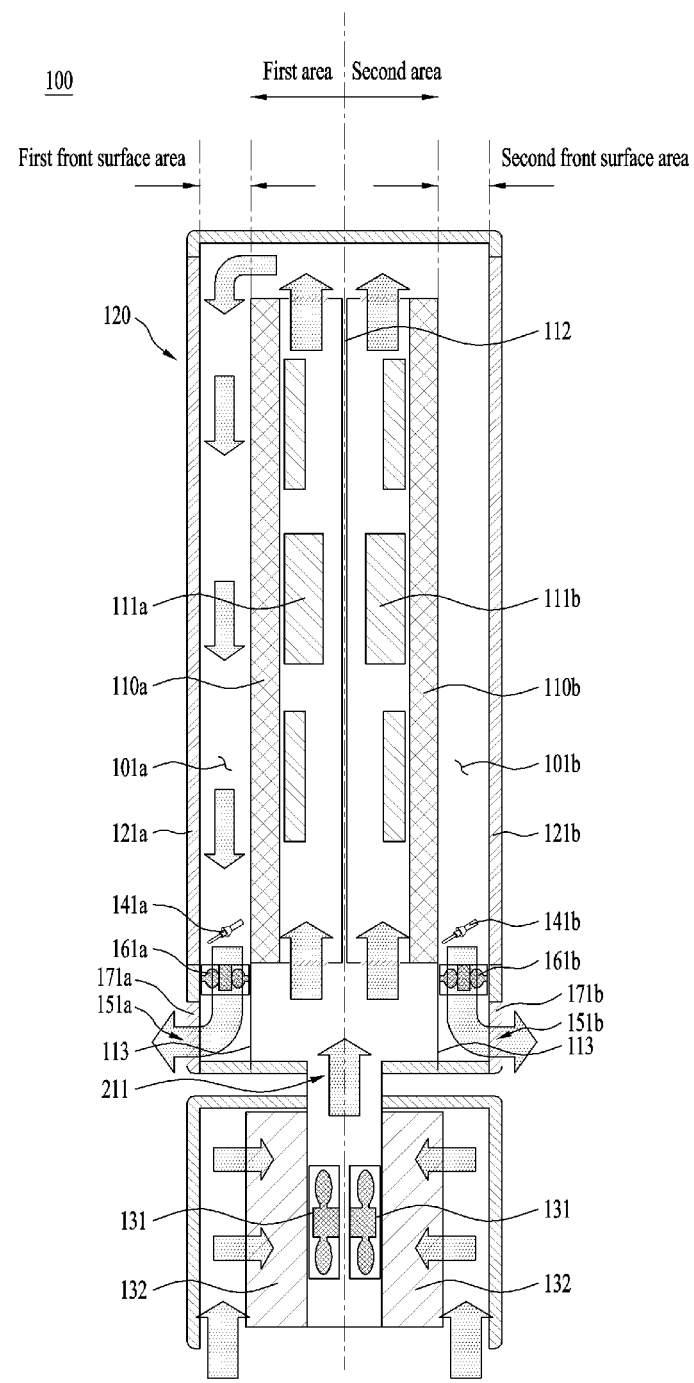
FIG. 2 is a diagram illustrating one example when the temperature in a first area of a display device related with FIG. 1 is higher than the temperature in a second area.

FIG. 2 is a diagram illustrating one example when the temperature in the first area of the display device 100 related with FIG. 1 is higher than the temperature in a second area.

When determining that the temperature in the first area is higher than the temperature in the second area based on the result of the temperature measurement as shown in FIG. 2, the flow rate controller may control the airflow generated by the first outlet fan 161a to be more than the airflow generated by the second outlet fan 161b. In contrast, when the temperature in the second area is higher than the temperature in the first area although not shown in the drawing, the flow rate controller may control the airflow generated by the second outlet fan 161b to be more than the airflow generated by the first outlet fan 161a. In some cases, the outlet fan 161 provided in one side may be driven and the other outlet fan 161 provided in the other side may not be driven.

As another example, the flow rate controller may control the airflow amount of the outlet fan 161 based on an absolute value in each area, without the comparison between the temperatures in the first and second areas. As one example, when the temperature in the first area is higher than a first critical temperature, the flow rate controller may drive the first outlet fan 161a to lower the temperature than the first critical temperature. When the temperature in the second area is higher than a second critical temperature, the flow rate controller may drive the second outlet fan 161b to lower the temperature than the second critical temperature. The first critical temperature and the second critical temperature may be set to be the highest range of temperatures that generates no performance deterioration or no deterioration of device durability.

Accordingly, the first outlet fan 161a and the second outlet fan 161b may be independently driven based on the temperatures in the first and second areas, to minimize power consumption. Furthermore, even when a different airflow is formed in the first area from a second area, the airflow amount drawn through the inlet hole 211 of the housing 120 is uniform to make the time to replace the dust filters 132 be similar.

Figure 3:
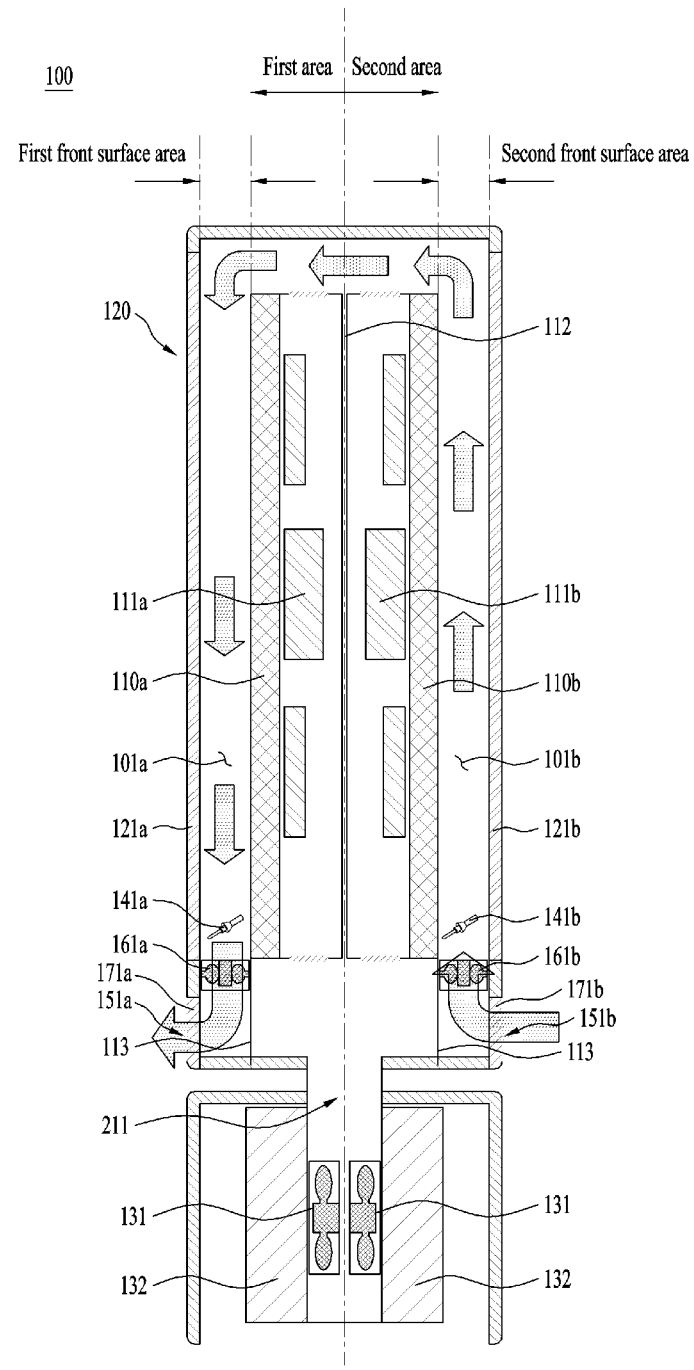
FIG. 3 is a diagram illustrating one example when a display device related with the present disclosure includes no backflow preventing part.

FIG. 3 is a diagram illustrating one example when the display device 100 related with the present disclosure includes no backflow preventing part 171.

A backflow preventing part 171 may be provided in each of the first and second outlet holes 151a and 151b to prevent air from being drawn through each of the outlet holes. A first backflow preventing part 171a may be provided in the first outlet hole 151a and a second backflow preventing part 171b may be provided in the second outlet hole 151b.

When one of the airflows formed by the first and second outlet fans 161a is relatively more than the other one, a lower pressure might be formed in the one of the outlet holes having the relatively less airflow and likely to allow air to be drawn therein from the outside.

As one example, when driving the first outlet fan 161a without driving the second outlet fan 161b, a negative pressure may be formed near the second outlet hole 151b and external air is likely to be drawn there through. The second backflow preventing part 171b may be configured to prevent the air drawing into the second outlet hole 151b and then the not-filtered external air from being drawn into the housing 120. Especially, such the air drawing might become severer when the lifespan of the dust filter 132 is about to over.

When the airflow caused by the second outlet fan 161b is more than the airflow caused by the first outlet fan 161a although not shown in the drawing, the above-mentioned case is opposed.

The outlet fans 161 may be provided adjacent to the respective outlet holes. When the outlet fans 161 are provided adjacent to the respective outlet holes, the airflows formed towards the outlet holes from the outlet fans 161 may not be mixed or stagnated again but discharged through the outlet holes smoothly.

The temperature measuring part 141 may be provided adjacent to the outlet hole. The heat of the display device 100 is likely to get stagnated and collected towards the outlet hole from the inlet hole 211 such that the temperature near the outlet hole 151 may become high. Accordingly, it is preferred to measure the temperature in the area where the highest temperature can be measured, considering the reliability of the display device 100.

As follows, embodiments of the present disclosure that are related with the arrangement and position of the outlet holes 151 will be described.

The description is made on the premise that the outlet fan 161 is provided in the lower end of the display device 100.

First Embodiment

The inlet hole 211, the first outlet hole 151a and the second outlet hole 151b may be provided in the lower end areas of the first and second displays 110a and 110b. here, the lower end area of the display may mean an area that is located under a middle area with respect to the vertical length of the display. Especially, it may be located lower than a vertical end of the display.

The air drawn from the lower end of the housing 120 may flow to the circuit unit 111 arranged between the first display 110a and the second display 110b and flow around an upper corners of the first and second displays 110a and 110b to pass front surfaces of the displays and flow through the first and second outlet holes 151a and 151b. During that flow process, the air may absorb all of the heat generated in the front surface area 101 of the display such that effective heat radiation may be performed.

As the display front surface area 101 generates the largest heat and have external light incident thereon directly, the largest heat is generated in the display front surface area 101 and the above-mentioned arrangement configured to form the air path passing the display front surface area 101 may be efficient.

The display lower end area may be partitioned off by the partition bracket 113 not to mix the air drawn into the circuit unit 111 via the inlet hole 211 and the air discharged from the display 110 via the outlet hole 151. The partition bracket 113 may be provided to partition off the area between the inlet hole 211 and the outlet hole 151 to circulate the air in the housing 120 uniformly.

At least predetermined area of the partition bracket 113, the display 110 and the housing 120 may form a path from the air inlet to the air outlet. In other words, the airflow of the first area and the airflow of the second area may form a turned-over shape of '⊏'.

Second Embodiment

Figure 4:
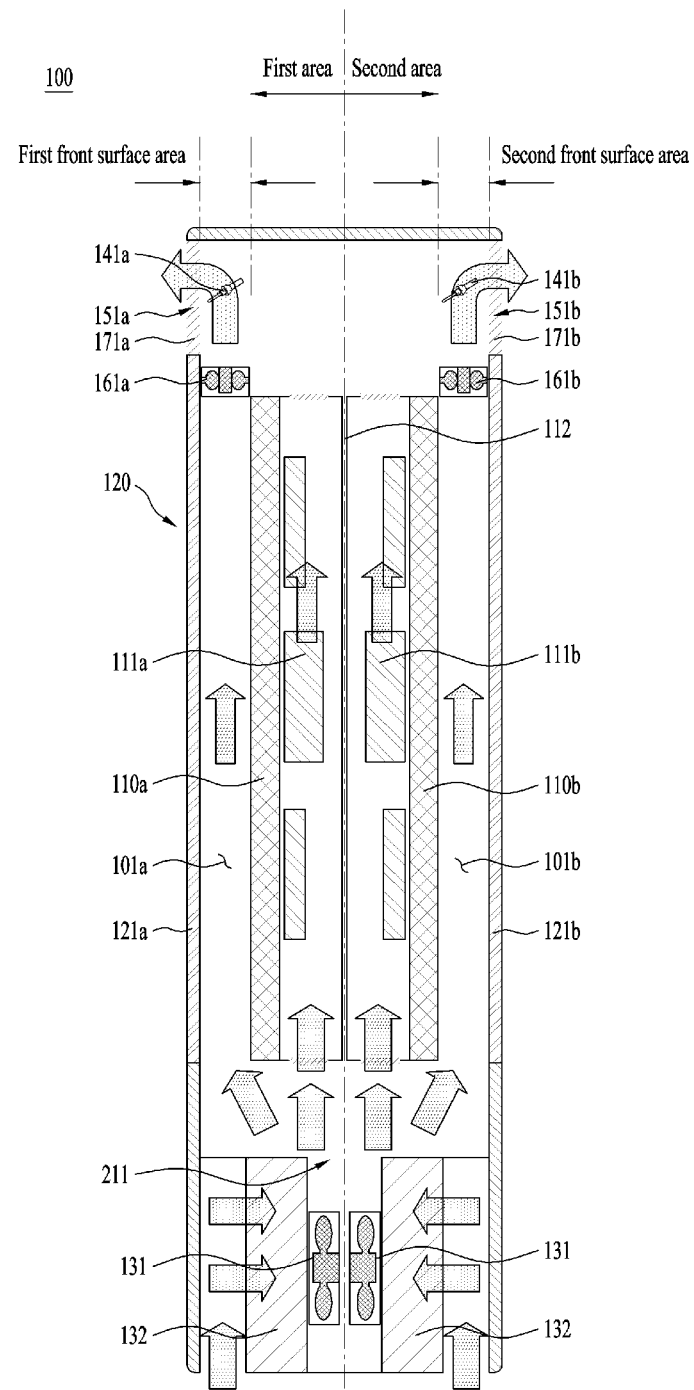
FIG. 4 is a diagram illustrating one embodiment of the display device related with the present disclosure.

FIG. 4 is a diagram illustrating one embodiment of the display device 100 related with the present disclosure.

As one embodiment, the inlet hole 121 may be provided in the lower end of the display and the first outlet hole 151a and the second outlet hole 151b may be provided in an upper end of the display 110. In other words, they may be provided upper than the upper end of the display with respect to a vertical direction that is a longitudinal direction of the display 110.

In the embodiment, the partition bracket 113 may not be provided. When the outlet hole 151 may be provided in the upper end of the display device 100 without the partition bracket 113, the air drawn via the inlet hole 211 may flow into not only the circuit unit 111 provided between the first and second displays 110a and 110b but also the front surface area provided between the displays 110 and the front surface of the housing 120. The air passing each of the areas may absorb heat and be discharged towards the upper end of the display device 110 via the outlet hole 151.

When the first outlet fan 161a is driven, the air of the first area may be mainly discharged. When the second outlet fan 161b is driven, the air of the second area may be mainly discharged to allow the air in the area having a relatively high temperature to discharge faster.

Similar to the first embodiment, the first temperature measuring part 141a and the second temperature measuring part 141b may be provided adjacent to the respective first and second outlet holes 151a and 151b so as to measure the temperature of the area having the highest temperature.

The first and second outlet fans 161a and 161b may be also provided adjacent to the respective first and second outlet holes 151a and 151b. in this instance, air may be effectively discharged outside as mentioned above.

The first and second outlet fans 161a and 161b may be provided between the display and the front surface of the housing 120 to discharge the air from the front surface area to the outside. The front surface area generates the most heat in the display device 100 such that the air and heat have to be intensively discharged from that area so as to enhance heat radiation efficiency.

Different from the first embodiment, this embodiment may form an air flow for drawing and raise cold air an area between the front surface area and the circuit unit 111 simultaneously. Accordingly, this embodiment may not retrograde a density difference principle that warm air rises and then enhance the heat radiation efficiency.

FIG. 5 is a diagram illustrating another embodiment that is different from the embodiment of FIG. 4.

Third Embodiment

Different from the embodiment of FIG. 4, this embodiment shows that the first and second outlet fans 161a and 161b may be spaced a predetermined height apart from the display 110. A difference between the pressures formed by the outlet fans 161 is likely to affect not only the front surface area but also the circuit unit area to allow the air to be discharged outside smoothly and entirely.

Especially, there is some concern that the air of the circuit unit 111 might be drawn into the front surface area through the lower end after failing to be discharged upwards in the above embodiment of FIG. 4. This embodiment may be provided to settle the concern.

The above-mentioned embodiments may be applied to one cross section with respect to one direction of the display device 100, not another cross section in another direction. As one example, the right and left areas of the displays 110 may be blocked by the housing 120. In other words, the airflow viewed in front of the display device 100 may be uniformly circulated, regardless of the right and left areas.

FIG. 6 is a diagram illustrating one example of the backflow preventing part 171 related with the present disclosure. As mentioned above, the backflow preventing part 171 may prevent external air from flowing back into the display device 100 via the outlet hole.

The backflow preventing part 171 may be configured to be driven by the gravity as one example. The backflow preventing part 171 may include a hinge unit 172 provided as a rotation axis of a thin film 173. The thin film 173 may be rotatable on the hinge unit 172 as the axis of the rotation in an outer direction of the display device 100. In a state where no airflow is generated by no driving of the outlet fans 151, the thin film 173 may not be rotated but moved downwards to block the outlet holes 151. Accordingly, the air inlet from the outside may be prevented. Even when the outlet fan 151 is driven, the thin film 173 may be rotated outwards with respect to the display device 100 to discharge the internal air from the display device 100.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims.

Therefore, all changes and modifications that fall within the metes and bounds of the claims, or equivalents of such metes and bounds, are therefore intended to be embraced by the appended claims.

INDUSTRIAL APPLICABILITY

The above-mentioned features and characteristics may be applied to all types of display devices partially and entirely.

What is claimed is:

1. A display device comprising:
a first display;
a second display comprising a back surface facing a back surface of the first display;
a housing in which the first display and the second display are mounted;
an inlet hole provided in the housing and configured to form a flow of external air drawn into the housing;
a first outlet hole formed in a first area where the first display is provided;
a second outlet hole formed in a second area where the second display is provided;
a first temperature measuring part configured to measure a temperature in the first area;
a second temperature measuring part configured to measure a temperature in the second area;
a first outlet fan configured to discharge the air in the first area through the first outlet hole;
a second outlet fan configured to discharge the air in the second area through the second outlet hole;
a first backflow preventing part provided in the first outlet hole and configured to prevent air from flowing back into the housing from the outside through the first outlet hole;
a second backflow preventing part provided in the second outlet hole and configured to prevent air from flowing back into the housing from the outside through the second outlet hole; and
a flow rate controller configured to:
drive the first outlet fan and the second outlet fan selectively based on the temperature measured in the first area and the temperature measured in the second area;
control an airflow caused by the first outlet fan to be more than an airflow caused by the second outlet fan when the temperature in the first area is higher than the temperature in the second area; and
control the airflow caused by the second outlet fan to be more than the airflow caused by the first outlet fan when the temperature in the second area is higher than the temperature in the first area.

2. The display device of claim 1, wherein the flow rate controller drives the first outlet fan when the temperature in the first area is higher than a first preset critical temperature, and drives the second outlet fan when the temperature in the second area is higher than a second preset critical temperature.

3. The display device of claim 1, wherein the first outlet fan is provided in a predetermined position of the first area that is adjacent to the first outlet hole, and the second outlet fan is provided in a predetermined position of the second area that is adjacent to the second outlet hole.

4. The display device of claim 1, further comprising:
an inlet fan configured to draw air into the housing through the inlet hole; and
a dust filter provided in the inlet hole,
wherein one inlet hole and one dust filter are provided.

5. The display device of claim 1, further comprising:
a circuit unit provided between the first display and the second display and configured to drive the first display or the second display;
a first front surface area formed between a front surface of the first display and a predetermined area of the housing that faces the front surface of the first display; and a second front surface area formed between a front surface of the second display and another predetermined area of the housing that faces the front surface of the second display.

6. The display device of claim 5, wherein the inlet hole, the first outlet hole and the second outlet hole are provided in a lower end of each display to discharge the air drawn through the inlet hole to the outside through the outlet holes after passing an upper end area of each display and each front surface area.

7. The display device of claim 6, further comprising:
a first partition bracket provided in a lower end of the first display and configured to partition off an area between the inlet hole and the first outlet hole; and
a second partition bracket provided in a lower end of the second display and configured to partition off an area between the inlet hole and the second outlet hole.

8. The display device of claim 5, wherein the inlet hole is provided in a lower end of each display, and the first outlet hole and the second outlet hole are provided in respective upper ends of the displays, and
the air having passed the inlet hole is drawn into the circuit unit and a lower end of the first front surface area simultaneously or the circuit unit and a lower end of the second front surface area simultaneously so as to flow towards upper ends of the displays.

9. The display device of claim 1, wherein the first temperature measuring part is provided adjacent to the first outlet hole and the second temperature measuring part is provided adjacent to the second outlet hole.

10. The display device of claim 1, wherein each of the first and second backflow preventing parts comprises:
a hinge unit; and
a thin film rotatably coupled to the hinge unit and configured to:
rotate to be open when the airflow is formed from the inside to the outside of the housing; and
rotate to be closed when the airflow is formed from the outside to the inside of the housing.

* * * * *